(12) United States Patent
Koenigsmann et al.

(10) Patent No.: US 6,708,870 B2
(45) Date of Patent: Mar. 23, 2004

(54) METHOD FOR FORMING SPUTTER TARGET ASSEMBLIES

(75) Inventors: Holger J. Koenigsmann, Congers, NY (US); Andrew C. Perry, Oradell, NJ (US); Thomas J. Hunt, Peekskill, NY (US); Paul S. Gilman, Suffern, NY (US)

(73) Assignee: Praxair S.T. Technology, Inc., North Haven, CT (US)

( * ) Notice: Subject to any disclaimer, the term of this patent is extended or adjusted under 35 U.S.C. 154(b) by 0 days.

(21) Appl. No.: 10/153,660

(22) Filed: May 24, 2002

(65) Prior Publication Data

US 2003/0218054 A1 Nov. 27, 2003

(51) Int. Cl.$^7$ ................................................ B23K 31/02
(52) U.S. Cl. ........................ 228/210; 228/174; 228/249
(58) Field of Search ................................. 228/115, 208, 228/226, 246, 210, 122.1, 170, 174, 248.1–262

(56) References Cited

U.S. PATENT DOCUMENTS

| | | | |
|---|---|---|---|
| 4,978,054 A | 12/1990 | Ferrando et al. | ............ 228/194 |
| 5,009,765 A | * 4/1991 | Qamar et al. | .......... 204/298.12 |
| 5,342,496 A | * 8/1994 | Stellrecht | ............... 204/298.12 |
| 5,487,822 A | 1/1996 | Demaray et al. | ...... 204/298.09 |
| 5,693,203 A | 12/1997 | Ohhashi et al. | ........ 204/298.12 |
| 5,766,380 A | 6/1998 | Lo et al. | ..................... 148/577 |
| 5,799,860 A | 9/1998 | Demaray et al. | ........... 228/194 |
| 5,803,342 A | 9/1998 | Kardokus | ................ 228/173.2 |
| 5,836,506 A | 11/1998 | Hunt et al. | .................. 228/172 |
| 5,963,778 A | 10/1999 | Stellrecht | .................... 428/554 |
| 5,985,115 A | 11/1999 | Hartsough et al. | ...... 204/298.09 |
| 6,071,389 A | 6/2000 | Zhang | ................... 204/298.12 |
| 6,085,966 A | * 7/2000 | Shimomuki et al. | ........ 228/193 |
| 6,092,427 A | 7/2000 | Hunt et al. | .................... 73/835 |
| 6,113,761 A | 9/2000 | Kardokus et al. | ....... 204/298.13 |
| 6,139,701 A | 10/2000 | Pavate et al. | .......... 204/192.17 |
| 6,164,519 A | * 12/2000 | Gilman et al. | ............... 228/107 |
| 6,287,437 B1 | * 9/2001 | Pandhumsoporn et al. | ...... 204/298.13 |
| 6,331,234 B1 | 12/2001 | Kardokus et al. | ....... 204/298.13 |
| 6,521,108 B1 | * 2/2003 | Zhang | ................... 204/298.13 |

FOREIGN PATENT DOCUMENTS

WO 9508438 3/1995

* cited by examiner

*Primary Examiner*—M. Alexandra Elve
*Assistant Examiner*—Len Tran
(74) *Attorney, Agent, or Firm*—Iurie A. Schwartz

(57) ABSTRACT

The method forms a sputter target assembly by attaching a sputter target to an insert and applying a bond metal layer between the insert and a backing plate. Then pressing the insert and backing plate together forms a solid state bond with the bond metal layer, attaches the insert to the backing plate and forms at least one cooling channel between the insert and the backing plate. A filler metal secures the outer perimeter of the insert to the backing plate in order to eliminate leakage from the cooling channel during sputtering of the sputter target.

9 Claims, 2 Drawing Sheets

METHOD FOR FORMING SPUTTER TARGET ASSEMBLIES

FIELD OF THE INVENTION

This invention relates to the field of sputter targets. In particular, this invention relates to methods for attaching backing plates to sputter targets.

BACKGROUND OF THE INVENTION

In a conventional sputter target assembly, the sputter target is attached to a non-magnetic backing plate. The backing plate holds the sputter target in a sputtering chamber and also provides structural support to the sputter target. In addition to this, the sputter target may contain cooling channels. During sputtering, water travels through these cooling channels to prevent over-heating of the sputter targets. Over-heating the sputter target can cause grain growth within the target and deflection of the target itself. Both grain growth and target deflection are disastrous to achieving uniform sputtering.

In view of these considerations, it is essential that sputter targets contain strong bonds with excellent thermal conductivity. Bonding techniques used to secure sputter targets include soldering, brazing, diffusion bonding, explosion bonding, mechanical fastening and epoxy bonding. Although commercial manufacturers use all of these techniques to manufacture sputter target assemblies, each of these techniques has certain disadvantages and none of the techniques provide a universal solution acceptable for all sputter target materials and configurations.

Brazing is the most common technique used to form a strong bond between a backing plate containing cooling channels and a sputter target. Unfortunately, this technique is not acceptable for sputter targets formed from aluminum or aluminum alloys, because the high temperatures associated with brazing increase the target's grain size to several millimeters. Similarly, the brazing of titanium targets to aluminum alloy backing plates often results in edge voids due the large difference in the coefficients of thermal expansion.

Hartsough et al., in U.S. Pat. No. 5,985,115, describe the use of epoxy bonding to attach a channeled backing plate to a sputter target—the channeling of the backing plate can easily reduce the total bond area by fifty percent. Although this epoxy bonding technique is useful for smaller targets, it lacks the strength required for large sputter target assemblies. In the unlikely event that an epoxy bond delaminates during sputtering, it destroys both a wafer in progress and the electrostatic chuck supporting the wafer. In view of this large cost associated with an inadequate bond, chip manufacturers are uncomfortable relying upon an epoxy bond to secure a sputter target for 300 mm wafers to a channeled backing plate.

Other less common techniques for securing sputter targets include explosion and diffusion bonding. Explosion bonding avoids the detrimental grain growth associated with brazing low temperature melting point sputter targets such as aluminum and aluminum alloy targets. But explosion bonding tends to both deform and collapse cooling channels, particularly cooling channels constructed from aluminum alloys. As illustrated by Kordokus et al. in U.S. Pat. No. 5,803,342, diffusion bonding is useful for some sputter target assembly combinations. Unfortunately, diffusion bonding often requires excessive temperatures and results in detrimental grain growth. In addition to this, the compressive forces required for diffusion bonding can press a soft target material into the backing plate's cooling channels.

Ohhashi et al., in U.S. Pat. No. 5,693,203, disclose the use of solid state bonding to avoid the high pressure and temperatures typically required for diffusion bonding. This patent describes pressing a metal foil between a backing plate and a sputter target to form a solid state bond. Although this technique produces a relatively strong bond, cooling channels can limit the surface area available to bond the backing plate to the sputter target and surface oxides or other impurities can have a significant impact on the bond's strength.

SUMMARY OF THE INVENTION

The invention provides a method of forming a sputter target assembly. The method includes attaching a sputter target to an insert and applying a bond metal layer between the insert and a backing plate. Then pressing the insert and backing plate together forms a solid state bond with the bond metal layer, attaches the insert to the backing plate and forms at least one cooling channel between the insert and the backing plate. A filler metal secures the outer perimeter of the insert to the backing plate in order to eliminate leakage from the cooling channel during sputtering of the sputter target.

DETAILED DESCRIPTION

Figure 1:
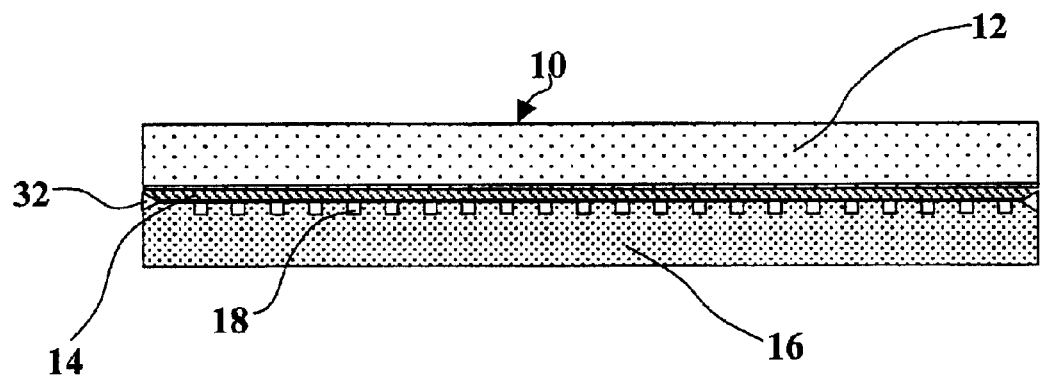
FIG. 1 is a schematic cross section of a channeled sputter target assembly secured with two solid state bonds and perimeter welding.

It has been discovered that a combination of solid-state bonding and securing a target insert to a backing plate with a filler metal surrounding the perimeter of a cooling or backing plate forms a strong bond for the most difficult to fabricate sputter target assemblies. For example, high-purity aluminum and aluminum alloy targets often require bonding to aluminum alloy cooling plates at temperatures low enough to retain a fine microstructure. Additionally, the pressure during bonding must remain low enough to keep a sputter target assembly's cooling channels intact and yet have sufficient strength to allow sputtering at high power densities without risking debonding of the target. Another difficult to form sputter target assembly combination is titanium sputter targets with aluminum backing plates. This combination has a large coefficient of thermal expansion mismatch that can cause severe edge voids upon cooling of brazed joints. Since these voids can result in water leakage through cooling channels, they are unacceptable for any titanium sputter targets having cooling channels fabricated into an aluminum alloy backing plate.

In particular, the method forms a sputter target assembly by attaching a sputter target to an insert. The sputter target to insert bond can rely on any type of bond that does not destroy the sputtering properties of the sputter target. Acceptable bonding techniques for attaching sputter targets to inserts include soldering, brazing, diffusion bonding, solid state bonding, explosion bonding, mechanical fastening and epoxy bonding. For titanium sputter targets, diffusion bonding a target into a recess within the insert is most advantageous. For aluminum and aluminum alloy sputter targets a solid state bond between the insert and the sputter target is most advantageous, because these bonds require low temperature processing that prevents uncontrolled grain growth within aluminum-base targets.

Applying a bond metal layer between the insert and a backing plate provides the mechanism for forming a solid state bond. Acceptable bond metals include the following precious metals: gold, silver, platinum, palladium, iridium, rhodium, ruthenium and osmium. For cost considerations, silver represents the most advantageous metal for forming solid state bonds. Acceptable techniques for coating with the bond metal layer include both the use of foils and electrodeposition techniques. For silver, the coating most advantageously arises from electrodepositing an equal thickness of silver on each surface bonded with a solid state bond. Advantageously, each electrodeposited side has a thickness of at least 15 $\mu$m. Most advantageously, the solid state bond layer has a total thickness of about 40 to 100 $\mu$m. If the bond layer is too thin, it may not have sufficient volume to compensate for the surface roughness contained in the insert or the backing plate. If the bond layer is too thick, it looses strength. Optionally, a copper strike coating of less than 5 $\mu$m prepares each surface for the silver and improves the target assembly's bond strength. This copper strike layer has a typical thickness of about 1 $\mu$m, which is sufficient for improving the bond strength to the substrate.

Pressing the insert and backing plate together with the bond metal layer sandwiched between the insert and backing plate forms a solid state bond attaching the insert to the backing plate. The pressing occurs in a direction perpendicular to the sputter target's top surface or face. When the sputter target assembly relies upon two solid state bonds, such as the insert to backing plate and insert to sputter target bonds, it is most advantageous to hot press these bonds simultaneously. Furthermore, it is possible to stack sputter target assemblies and use pressing to form solid state bonds in several targets at the same time. Either hot uniaxial pressing or hot isostatic pressing are the most advantageous methods for forming solid state bonds between target assembly components. In addition, for most bond metal solid state bonds, heating the bond to a temperature below the sputter target's grain growth temperature improves the solid state bond's integrity.

If the insert and backing plate are aluminum alloys, then the pressing advantageously occurs at a pressure below about 70 MPa and at a temperature of less than about 320° C. Generally, increasing pressing temperature improves the bond's strength, but increases the likelihood for detrimental grain growth within the sputter target. Most advantageously, the pressing occurs at a temperature between about 260 and 320° C. and pressing occurs at a pressure below about 35 MPa. Under these conditions, cooling channels remain intact and aluminum and aluminum alloy sputter targets' microstructures remain unchanged—the process's temperature does not change the microstructure of aluminum alloy sputter targets, such as Al-0.5 wt. % Cu. Solid state bonding the insert to the backing plate forms at least one cooling channel between the insert and the backing plate. Advantageously, the solid state bonding forms a plurality of cooling channels. It is possible to machine the cooling channels into the insert, the backing plate or both the backing plate and insert. For practical purposes however, it is generally most advantageous to machine the grooves only into the backing plate.

A filler metal secures the outer perimeter of the insert to the backing plate. After depositing the filler metal by either brazing or welding, the filler metal solidifies to secure the outer perimeter of the insert to the backing plate. The filler metal eliminates leakage from the cooling channels during sputtering of the sputter target. In addition, the insert advantageously protects the sputter target from direct contact with the bead of molten metal to prevent dilution of the sputter target and limit grain growth of the sputter target during brazing or welding. Most advantageously, welding occurs with a single pass under the protection of a controlled atmosphere or under a flux for limiting the oxidation of the insert and the filler metal. Examples of protective atmospheres include argon, carbon dioxide, helium, hydrogen and mixtures thereof. In addition, when securing an aluminum alloy backing plate to an aluminum alloy insert, it is most advantageous to deposit an aluminum alloy filler metal to match coefficients of thermal expansion and minimize cracking.

Optionally, machining a groove into the insert, solid state bond between the insert and the backing plate, and the backing plate forms a perimeter groove for the filler metal. Most advantageously, the perimeter groove forms a channel having a V-shaped cross section. The V-shaped cross section forms secure solid state bonds with minimal void formation. Alternatively, it is possible to simply construct the target assembly with an insert having a reduced diameter and filling a gap formed between the sputter target and the backing plate. However, this approach typically does not form the V-shaped cross section groove for welding. This approach has the disadvantage of allowing direct contact between the filler metal and the sputter target. For some cylindrical-shaped targets where sputtering does not occur adjacent the outer perimeter of the target, it is acceptable to weld directly to the target itself without detrimentally impacting the sputter target's performance.

Referring to FIG. 1, a sputter target assembly 10 contains sputter target 12, insert 14 and backing plate 16 bonded together. The backing plate 16 contains multiple cooling channels 18 for water cooling the sputter target 12 during sputtering operations. Advantageously constructing the insert 14 and backing plate 16 from either an aluminum or copper alloy provides excellent conductivity for improved water cooling. Most advantageously, constructing the insert 14 and backing plate 16 from an aluminum alloy, such as alloy 6061, provides a good combination of strength for supporting the target and conductivity for cooling the target.

Figure 2:
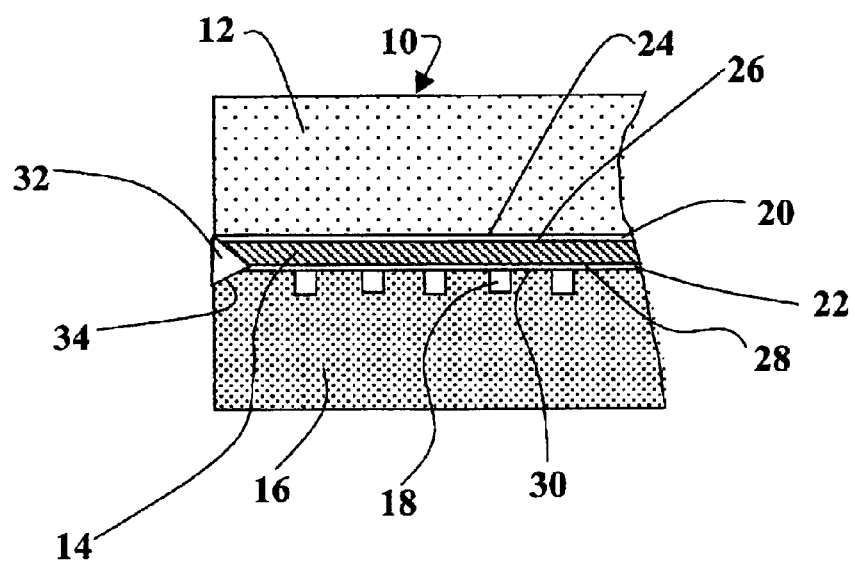
FIG. 2 is an enlarged schematic cross section of a portion of the channeled sputter target assembly of FIG. 1.

Referring to FIG. 2, solid state bonds 20 and 22 secure the backing plate 16 to the insert 14 and the insert 14 to the sputter target 12. Any metal that bonds at low temperatures can form the solid state bond. Advantageously, a bond metal forms both solid state bond layers 20 and 22. For example, electrodepositing silver to the rear surface 24 of sputter target 12, top surface 26 and rear surface 28 of insert 14 and the top surface 30 of the backing plate provides an excellent bond after pressing the components together at low temperatures.

In addition to the solid state bonding, filler metal 32 secures the perimeter of backing plate 16 to insert 14. Insert 14 protects the sputter target 12 from the heat arising from depositing filler metal 32 into groove 34. In addition to this, the insert 14 also prevents molten filler metal from contaminating sputter target 12. The process can use either brazing or welding techniques to deposit filler metal. Most advantageously, the filler metal has a composition that closely matches the backing plate's composition.

Figure 3:
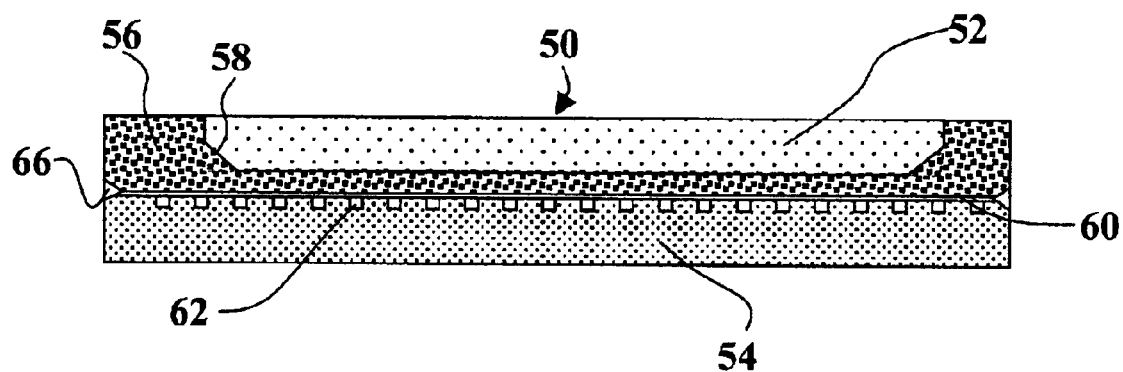
FIG. 3 is a schematic cross section of a channeled sputter target assembly secured with a single solid state bond, a side diffusion bond and perimeter welding.

Referring to FIG. 3, an alternative method forms a sputter target assembly 50 that contains a sputter target 52, backing plate 54 and the sputter target 52 side bonded to an insert 56. The insert 56 contains a recess 58 for supporting the sputter target 52. This side bonding configuration is most advantageous for connecting titanium sputter targets to aluminum alloy backing plates. Roughening the bonding surfaces of the sputter target 52 and the recess 58 advantageously improves the side bond's strength. Most advantageously, pressing the sputter target 52 into the recess 58 at elevated temperature forms a strong diffusion bond between the sputter target and the backing plate.

Figure 4:
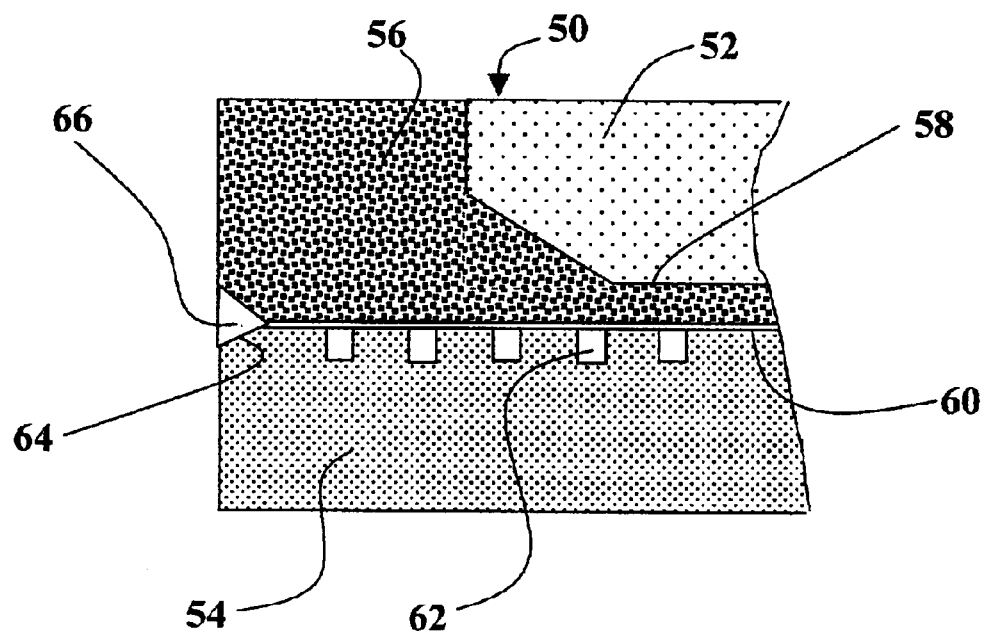
FIG. 4 is an enlarged schematic cross section of a portion of the channeled sputter target assembly of FIG. 3.

Referring to FIG. 4, the insert 56 is attached to the sputter target 52, and the solid state bond layer 60 connects backing plate 54 to the insert 56. Connecting the insert 56 to the backing plate 54 forms cooling channels 62. Machining a groove into backing plate 54, bond 60 and insert 56 forms a perimeter groove 64. Then depositing filler metal 66 into the perimeter groove 64 secures the insert 56 to the backing plate 54 and prevents leakage through the cooling channels 62 during sputtering of the sputter target 52.

EXAMPLE 1

An aluminum target blank containing 0.5 wt. % copper, a 0.20 inch (0.51 cm) thick 6061 aluminum alloy insert, and a 6061 aluminum alloy backing plate having 0.08 inch (0.20 cm) wide, 0.10 inch (0.25 cm) deep cooling channels spaced 0.64 inch (1.6 cm) apart were plated with 1 $\mu$m of copper and 25 $\mu$m of silver, followed by a bake-out at 204° C. for 22 hours. The three blanks were then bonded together in a single cycle by hot isostatic pressing for 4 hours at a temperature of 316° C. and a pressure of 35 MPa.

Immersion ultrasonic examination revealed 100% bonding in the planar areas between the cooling channels, while X-ray imaging showed that the cooling channels themselves were kept intact—the cooling channels filled with the target material during pressing under the above conditions without the 6061 aluminum alloy insert. A target blank grain size of 42 $\mu$m was determined per ASTM standard E112-96 using optical microscopy. This indicated that the grain size did not change during the bonding process.

The solid state bond was evaluated by removing a 5 inch (12.7 cm) long by 1 inch (2.5 cm) wide sample of the bond interface, forming a through hole 0.625 inch (1.6 cm) from one end, and removing the bond interface in the area of the hole, thereby splitting the hole into two holes. The holes were grasped by tapping the holes and inserting threaded rods therein, and the layers were pulled apart by applying oppositely directed forces to the rods. Bond separation occurred at a maximum load of 2,140 lbs (971 kg).

After solid state bonding, a triangular or V-shaped groove measuring 0.15 inch (0.38 cm) in depth and having an apex angle of 74 degrees was machined into the target assembly's insert, bond layer and backing plate. A continuous bead of 4047 aluminum alloy then filled the entire groove in a single pass by tungsten inert gas arc welding. In particular, the welding relied upon a Miller Aerowave welding machine using a shield gas containing 50% helium and 50% argon at a current of 250 A. The V-shaped groove protected the sputter target from dilution and from the excessive heat generated by welding. Finally, machining smoothed the side surface of the target assembly.

EXAMPLE 2

In this Example, a titanium sputter target was diffusion bonded to a 6061 aluminum alloy insert by side bonding into a recess contained in the insert at a temperature of 450° C. and a pressure of 103 MPa. Roughening the side surfaces of the insert and target to a surface roughness of 150 microinches Ra improved the bond's strength. This subassembly and a 6061 aluminum alloy backing plate having 0.08 inch (0.20 cm) wide, 0.10 inch (0.25 cm) deep cooling channels spaced 0.64 inch (1.6 cm) apart were plated with copper and silver, baked out and bonded under the conditions of Example 1 to form a solid state bond. Immersion ultrasonic examination revealed 100% bonding between the cooling channels; and X-ray imaging showed that the cooling channels themselves were kept intact. A target blank grain size of 10 $\mu$m was determined per ASTM standard E112-96 using optical microscopy indicating that the grain size did not change during the bonding process.

After solid state bonding, a triangular groove as described in Example 1 was machined into the target assembly's insert and backing plate. A continuous bead of 4047 aluminum alloy then filled the entire groove by welding under the conditions described in Example 1. Finally machining smoothed the side surface of the target assembly leaving the filler metal to prevent leakage from the cooling channels.

The process of the invention provides an improved method for attaching channeled backing plates to difficult to fabricate target assemblies. A solid state bond attaches an insert to a backing plate to form at least one cooling channel and perimeter filler metal attaches the insert to the backing plate to prevent leakage from the cooling channels during sputtering and improve the bond strength of a backing plate to an insert. This design also eliminates edge voids from thermally mismatched sputter targets, while leaving the cooling channel's cross section intact.

For purposes of the specification, a solid state bond represents a bond formed without a significant amount of diffusion into the base metal or base metal into the bond alloy, typically less than 10 $\mu$m and most often less than 5 $\mu$m. In addition, unless specifically noted otherwise, the specification lists all compositions by weight percent.

The bake-out and bonding parameters can be varied depending on the material, the desired microstructure, and the geometry of the cooling plate. The invention can be practiced using pure aluminum, various aluminum alloys, or titanium bonded to backing or cooling plates of various aluminum or copper alloys.

Although the invention has been described in detail with reference to certain preferred embodiments, those skilled in the art will recognize that there are other embodiments of the invention within the spirit and the scope of the claims.

We claim:

1. A method of forming a sputter target assembly comprising the steps of:
    attaching a sputter target to an insert;
    applying a bond metal layer between the insert and a backing plate, the insert having an outer perimeter;
    pressing the insert and backing plate together to form a solid state bond with the bond metal layer, the solid state bond attaching the insert to the backing plate and forming at least one cooling channel between the insert and the backing plate; and
    securing the outer perimeter of the insert to the backing plate with a filler metal that attaches the outer perimeter of the insert to the backing plate and eliminates leakage from the at least one cooling channel during sputtering of the sputter target.

2. The method of claim 1 wherein the insert and backing plate are aluminum alloys and the pressing occurs at a pressure below about 70 MPa and at a temperature of less than about 320° C.

3. The method of claim 1 including the additional step of machining a groove into the insert, bond metal layer and the backing plate; and the securing step fills the groove with the filler metal.

4. A method of forming a sputter target assembly comprising the steps of:

attaching a sputter target to an insert;

applying a bond metal layer between the insert and a backing plate, the insert having an outer perimeter;

pressing the insert and backing plate together to form a solid state bond with the bond metal layer, the solid state bond attaching the insert to the backing plate and forming at least one cooling channel between the insert and the backing plate; and securing the outer perimeter of the insert to the backing plate by depositing a filler metal that attaches the outer perimeter of the insert to the backing plate and eliminates leakage from the at least one cooling channel during sputtering of the sputter target, the insert protecting the sputter target from direct contact with a bead of molten metal during the depositing of the filler metal to prevent contamination of the sputter target and limit grain growth within the sputter target.

5. The method of claim 4 wherein the insert and backing plate are aluminum alloys and the pressing occurs at a pressure below about 70 MPa and at a temperature of about 260 to 320° C.

6. The method of claim 4 including the additional step of machining a groove into the insert, bond metal layer and the backing plate; and the securing step fills the groove.

7. A method of forming a sputter target assembly comprising the steps of:

applying a bond metal layer between an insert and a sputter target and between the insert and a backing plate, the insert having an outer perimeter;

pressing the sputter target, insert and backing plate together to form solid state bonds with the bond metal layer, the solid state bonds attaching the sputter target to the insert and the insert to the backing plate and forming at least one cooling channel between the insert and the backing plate; and securing the outer perimeter of the insert to the backing plate by depositing a filler metal that solidifies to attach the outer perimeter of the insert to the backing plate and to eliminate leakage from the at least one cooling channel during sputtering of the sputter target, the insert protecting the sputter target from direct contact with a bead of molten metal during the depositing of the filler metal to prevent dilution of the sputter target and limit grain growth within the sputter target.

8. The method of claim 7 wherein the insert and backing plate are aluminum alloys and the pressing occurs at a pressure below about 35 MPa and at a temperature of about 260 to 320° C.

9. The method of claim 7 including the additional step of machining a groove into the insert, bond metal layer and backing plate; and the securing step fills the groove.

* * * * *